March 19, 1940. A. D. BLUMLEIN Re. 21,400

SWEEP CIRCUIT

Original Filed April 1, 1933 2 Sheets-Sheet 1

INVENTOR
ALAN DOWER BLUMLEIN
BY T. R. Goldsborough
ATTORNEY

INVENTOR
ALAN DOWER BLUMLEIN
BY T. R. Goldsborough
ATTORNEY

Reissued Mar. 19, 1940

Re. 21,400

UNITED STATES PATENT OFFICE 21,400

SWEEP CIRCUIT

Alan Dower Blumlein, Ealing, London, England, assignor to Electrical and Musical Industries Limited, Hayes, Middlesex, England, a company of Great Britain Original No. 2,063,025, dated December 8, 1936, Serial No. 663,977, April 1, 1933. Application for reissue November 26, 1938, Serial No. 242,508. In Great Britain April 4, 1932

12 Claims. (Cl. 250—27)

Figure 1:
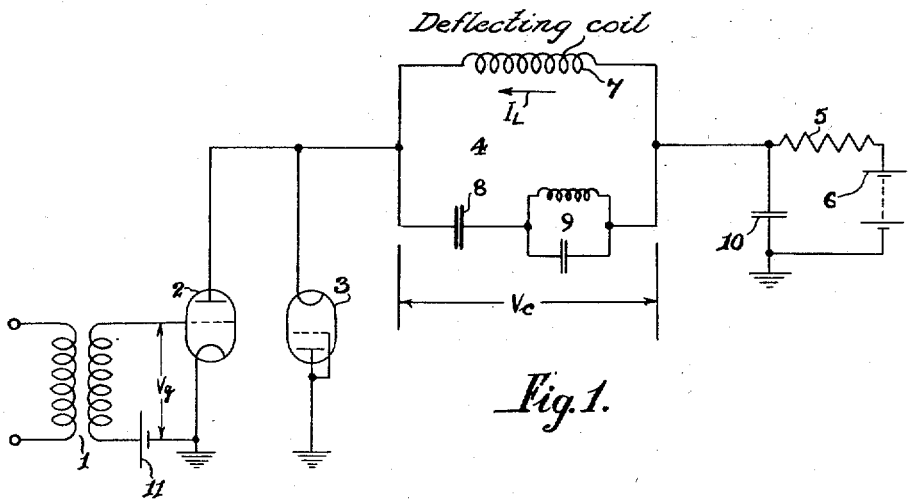

The present invention relates to oscillatory electric circuits such as may be used for example as time bases in connection with cathode ray devices, for the purpose of producing periodic deflection of the ray.

The invention is mainly concerned with the generation of non-sinusoidal oscillations adapted to produce deflection of the cathode ray of the kind in which each cycle of deflection comprises a relatively slow motion in one direction followed by a relatively rapid motion in the opposite direction. Arrangements of this kind are, for example, used in television receivers in which reconstitution of a line of the transmitted image occurs during the slow motion of the ray and the rapid motion constitutes the return stroke which is necessary before the next line of the image can be reconstituted. The requirements of such arrangements are, amongst other things, that the slow motion shall be a uniform one and that the return stroke shall be rapid.

According to the present invention there is provided an oscillation generator adapted to generate periodic electrical oscillations of other than sinusoidal wave form in which the wave form of one portion of each cycle of the generated oscillations is determined by a circuit comprising a reactive element or a plurality of reactive elements and in which the wave form of another portion of the cycle is determined by a circuit having different reactive properties from the first circuit, switching means being provided for transferring the control of wave form periodically from one of the circuits to the other. Where the natural frequency of the generated oscillations is high, the switching means may conveniently be in the form of a thermionic device and impulses serving to control the frequency of the generated oscillations may be applied to the grid circuit of the device. The wave form of the generated oscillations can thus be made independent of the wave form of the impulses within wide limits. The thermionic device can be made to function as a switch by arranging that its anode-cathode impedance is very small compared with the impedances with which it is associated during the "closed" periods and very large compared with these impedances during the "open" periods. Where lower frequencies are to be generated, the switching means may be mechanical.

The present invention further provides apparatus for generating periodic electrical oscillations of other than sinusoidal wave form, comprising means whereby the wave form of the generated oscillations is adapted, during the greater part of each cycle, to be controlled substantially by an inductance and, during the remainder of each cycle, by the resonant frequency of a tuned circuit. The apparatus may be such that the generated current, during the greater part of each cycle, is substantially that due to the voltage of a source applied across an inductance or it may be such that the generated voltage, during the greater part of each cycle, is substantially that built up across a condenser due to the flow of current thereto from a source through an inductance. In both cases, however, the current or voltage during the remainder of each cycle may be that due to a half cycle of oscillation of a tuned circuit.

According to a feature of the present invention as applied to cathode ray devices, the rapid motion of the ray is effected under the control of one half cycle of oscillation of a resonant circuit. Preferably, the rate of the slow motion is determined by the value of an inductance and the rate of the rapid motion is determined by the natural frequency of a resonant circuit.

According to a further feature of the present invention there is provided a source of electrical energy and means for applying from this source to the control coil or electrodes, which serve to deflect a cathode ray, a periodic voltage of predetermined wave form having a maximum voltage greatly exceeding that of the source.

The invention will be described, by way of example, with reference to the accompanying drawings, in two embodiments but it will be realized that there are many other embodiments within the scope of the invention.

Figure 2:
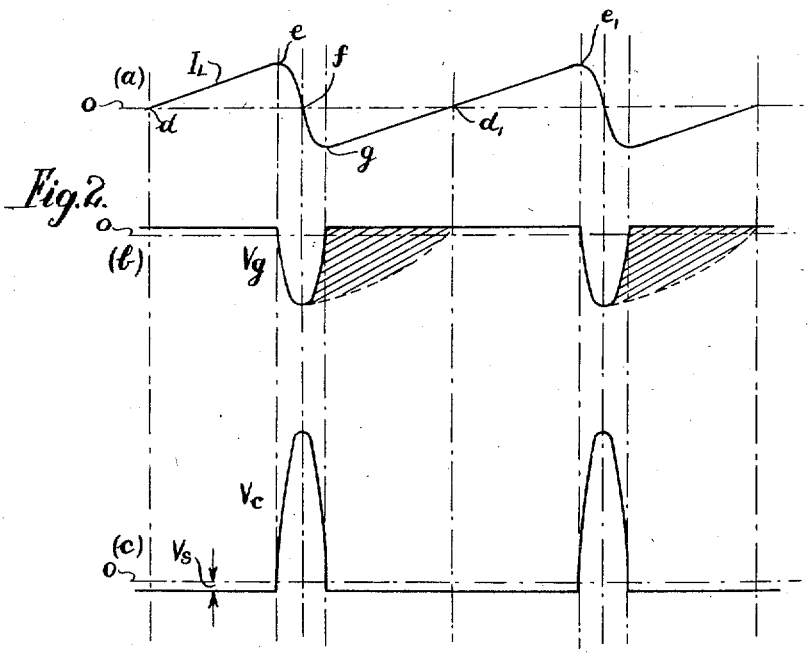
Figure 3:
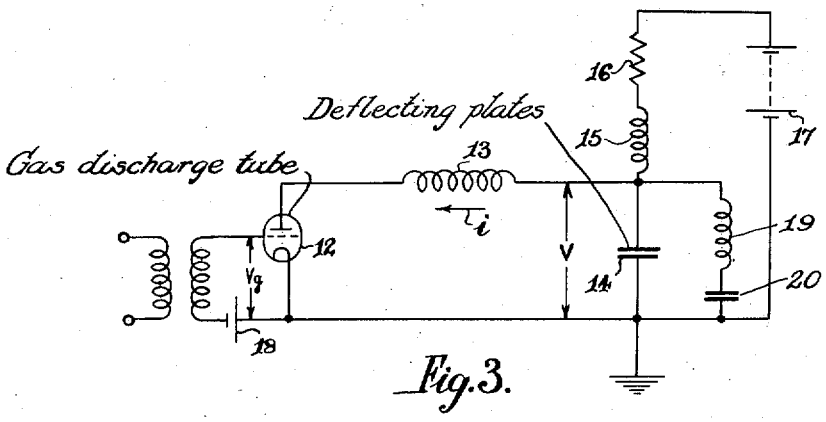
Figure 4:
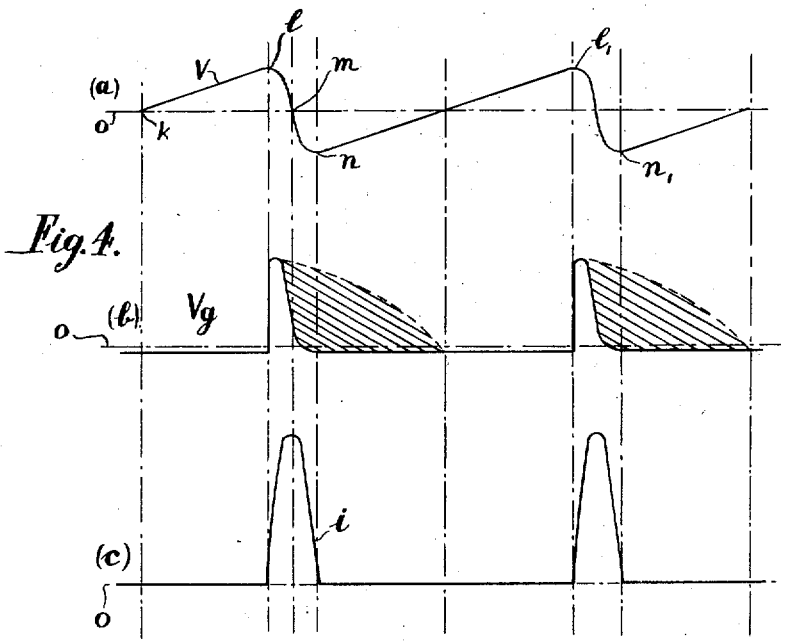

In the drawings, Figs. 1 and 3 are circuit diagrams showing alternative arrangements according to this invention, and Figs. 2 and 4 are diagrams illustrating the operation of the arrangements of Figs. 1 and 3 respectively.

The first embodiment to be described with reference to Fig. 1 is suitable for use with a cathode ray tube in which the ray is deflected magnetically by means of an electric current passed through a control coil. The periodicity of the deflections is determined by electrical impulses, for example synchronizing impulses transmitted from a television transmitter.

The synchronizing impulses are applied through a transformer 1 to the grid circuit of a thermionic triode 2 having a thermionic diode 3 shunted across its anode-cathode circuit, the cathode of the diode being connected to the anode of the triode. The anode of the triode is connected through a parallel resonant circuit 4 and a suitable impedance 5, such as a resistance, to the positive terminal of a source of high tension 6, the negative terminal of the source being connected to the cathode of the triode 2. The tuned circuit 4 comprises, as inductance, the control coil 7 of the cathode ray device (not shown) and this is shunted by a condenser 8 in series with an auxiliary parallel resonant circuit 9. The purpose of this auxiliary circuit 9 will be described later and for the purpose of the preliminary description it will be assumed to be short-circuited. In any case its impedance at the resonant frequency of the main tuned circuit is low. A large condenser 10 is connected from the cathode of the triode to a point between the tuned circuit 4 and the resistance 5 for the purpose of maintaining the voltage of the high tension source at a steady value. Suitable biasing means 11 are provided to maintain the grid of the triode 2 slightly positive in relation to the cathode in the absence of a received impulse.

The operation of the circuit will be described with reference to Fig. 2 in which time is the abscissa and the ordinates are: in curve (*a*) the current $I_L$ in inductance 7; in (*b*) the voltage $V_g$ impulses applied to the grid of triode 2; and (*c*) the voltage $V_C$ developed across the tuned circuit 4.

The cycle of deflection will be assumed to begin with the ray in its midposition, that is to say with the scanning spot in the middle of the reproducing screen. Under these conditions the current through the control coil is zero but increasing in a direction which will for convenience of description be referred to as positive and indicated by the arrow $I_L$ in Fig. 1. The ratio of the resistance of the coil 7 to its inductance is made low and the anode-cathode impedance of the triode 2 is also low due to the positive bias on its grid and therefore the rate of increase of current through the control coil and triode due to the voltage of the source 6 is determined substantially entirely by the inductance of the coil 7. The current $I_L$ through the coil thus rises at a uniform rate from *d* to *e* (Fig. 2 (*a*)) until a scanning impulse is received (Fig. 2 (*b*)). This impulse serves to make the grid of the triode negative relative to the cathode and the anode-cathode impedance high. The flow of current through the control coil 7 cannot be stopped suddenly because of the inductance thereof and, since the path through the triode has become of high impedance, the current is deflected into the condenser 8 of the tuned circuit 4 which is thereby charged. The voltage across the anode-cathode of the triode will now rise to a high value and the grid thereof must therefore by this time have been raised to a sufficiently high negative value, by the received impulse, to prevent appreciable current flow through the triode. After a time interval, (measured from the moment when the synchronizing impulse was received) equal to that of one quarter of a cycle of oscillation of the tuned circuit at its resonant frequency and represented by the distance along the abscissa in Fig. 2 (*a*) between points *e* and *f*, the current through the control coil 7 has fallen to zero and the condenser commences to discharge thus causing current to flow through the coil in a negative sense. By the time that the condenser 8 has become fully discharged a further quarter cycle of oscillation at the resonant frequency of the tuned circuit 4 has been executed and the current is at point *g* Fig. 2 (*a*). Due to the negative current now flowing in the coil, the condenser commences to charge in the reverse direction but this reverse charging ceases almost immediately due to flow of current through the diode 3. The high tension voltage of the source 6 opposes the flow of current in a negative direction through the coil 7 and this current is reduced at a steady rate to zero as represented by $g$—$d_1$ Fig. 2 (*a*), thus completing the cycle.

It will be noted that during the greater portion of each cycle (constituting the scanning stroke), namely *g* to $e_1$ Fig. 2 (*a*), the wave form of the current through the control coil 7 is determined substantially by the inductance of this coil and the voltage of the source and during this portion of the cycle the rate of change of current in the coil is, therefore, substantially uniform. The cathode ray is thus swept at a uniform rate across the reproducing screen. During the remainder of the cycle (constituting the return stroke), and represented between points *e* and *g* Fig. 2 (*a*), the wave form of the current in the coil is determined by the natural frequency of the tuned circuit 4 which during this period executes one half cycle of oscillation at its resonant frequency. Further, the voltage developed across the control coil reaches, during each cycle, a peak value greatly exceeding the voltage of the source 6. This is shown clearly in Fig. 2 (*c*) where the distance $V_S$ represents the voltage of the source 6.

The wave form of the generated wave will be substantially independent of the wave form of the received impulse provided that this impulse makes the grid sufficiently negative and that it does not maintain the negative grid polarization for longer than one half the scanning stroke. The grid voltage may for example be anywhere within the shaded areas in Fig. 2 (*b*).

The circuit described depends upon a half cycle of oscillation of a tuned circuit to produce the back stroke and is liable to give alternate scanning strokes of different mean positions due to persistence of oscillations at one half the scanning frequency. The auxiliary tuned circuit 9 which is arranged in series with the condenser 8 of the main tuned circuit 4 is provided to prevent this. The auxiliary tuned circuit 9 is arranged to resonate at half the scanning frequency whilst the condenser and inductance constituting it are of low impedance and good efficiency. Further the value of the inductance is so chosen that series resonance with the condenser 8 of the main tuned circuit occurs at a frequency not lower than one third of the scanning frequency. The auxiliary tuned circuit may, if desired, be connected in the high tension supply between the large shunt condenser 10 and the main tuned circuit 4.

In determining the capacity of the main tuned circuit 4 this should be taken as including, with the condenser 8 thereof, the self-capacity of the control coil 7 and the associated valves 2 and 3.

The diode 3 should be selected to have a reasonably low impedance and the triode 2 should also have a low impedance with a suitable value of positive grid bias. Both valves should be capable of withstanding high voltages and should have high impedance, in the case of the triode with suitable negative potential on the grid and in the case of the diode for negative voltages applied to its anode. The impedance of the valves at low currents may be decreased by arranging, in series with the diode, a source of E. M. F. adapted to produce a small normal circulating current between the tubes.

The negative pulse required to raise the impedance of the triode is usually relatively high and it must be supplied against the maximum capacity of the valve due to the "Miller" effect. In order to decrease the amplitude of the negative pulse required, coupling in a suitable sense may be provided between the coil 7 and the transformer 1. For example, a coil may be arranged in series with the secondary winding of the transformer 1 and this coil may be coupled, not very tightly, to the control coil 7 in such a sense that the change in current in the control coil 7 due to the synchronizing impulse serves to increase the negative potential on the grid. Further the leakage inductance of this additional coil together with the capacity of the triode 2 serves to delay the negative pulse.

In the second embodiment of the invention illustrated in Fig. 3, a triode 12 of the gaseous discharge type is used. This type of triode has the property that its anode-cathode impedance remains high so long as its grid is maintained at a suitable negative potential relative to the cathode. On suitably reducing the negative potential, however, the impedance falls to a low value and remains at this low value, irrespective of any potentials applied to the grid, until the anode voltage has been reduced to a certain value.

Between the anode and cathode of a triode of this kind there is connected an inductance 13 in series with a condenser 14 constituting a tuned circuit. The condenser represented by 14 consists of the capacity between the electrostatic control electrodes of a cathode ray tube (not shown) increased by a parallel condenser to a suitable value, for example 0.002 microfarad. The point of connection between the inductance 13 and condenser 14 is connected through an inductance 15 and a resistance 16 (which will be termed the feed impedance) to the positive terminal of a source 17 of high tension, the negative terminal of the source being connected to the cathode of the triode.

The curves of Fig. 4 illustrate the behaviour of this circuit. In each curve the abscissa is time and the ordinates are: in (*a*) the voltage V across condenser 14; in (*b*) the voltage impulses $V_g$ applied to the grid of the triode 12; and in (*c*) the current *i* flowing in inductance 13.

Once more assuming the cycle to commence with the scanning spot in the centre of the reproducing screen, as represented by point *k* Fig. 4 (*a*), the charge upon the condenser 14 is zero but increasing due to current from the source 17 flowing through the feed impedance 15, 16. The grid of the triode 12 is held at a suitable negative value by biasing means 18 and the current through the inductance 13 of the tuned circuit is thus negligible. The voltage across the condenser 14 therefore rises until a positive synchronizing impulse is applied to the grid of the triode as represented by point *l*. The impedance of the triode 12 is now very small and the condenser discharges through the inductance 13 of the tuned circuit at a rate dependent upon the natural frequency thereof. The feed impedance 15, 16 is made sufficiently high to prevent appreciable flow of current through it during the short period of the condenser discharge. When the tuned circuit has executed one quarter of a cycle of oscillation (points *l* to *m* Fig. 4 (*a*)) the condenser 14 has discharged and, due to the current now flowing in the inductance 13, charges up in the reverse direction, the tuned circuit thus executing a second quarter cycle of oscillation (points *m* to *n* Fig. 4 (*a*)). The current through the inductance 13 is now zero and the voltage across the anode circuit of the triode is therefore zero also while due to the low impedance oscillatory nature of the circuit during this half cycle the polarity of the charge on the condenser 14 is reversed and is practically equal in opposite magnitude to the original charge. The impedance of tube 12 has accordingly returned to its original high value. The condenser cannot draw current through the inductance 13 of the tuned circuit and accordingly current commences to flow through the feed impedance 15, 16 until the voltage across the condenser is once more zero (point $k_1$) and the cycle has been completed.

In this arrangement the wave form of the voltage across the condenser is controlled during the greater part of each cycle, that is from *n* to $l_1$ and during the scanning stroke, by the flow of current thereinto through the inductance 15 of the feed impedance, and during the remainder of the cycle, that is during the return stroke, *l* to *n* or $l_1$ to $n_1$ by the natural frequency of the tuned circuit 13, 14 which executes one half cycle of oscillation at its resonant frequency.

The positive impulse applied to the grid need only last for long enough to trigger the Thyratron 12 but it may if desired persist until the middle of the scanning stroke, after which the grid must be negative. The impulses may be anywhere within the shaded areas of Fig. 4 (*b*), for example.

In this example also, the voltage developed across the control electrodes can exceed greatly the voltage of the source since the voltage is determined by the flow of current through the inductance of the feed impedance.

In this case also it is desirable to provide an auxiliary circuit to prevent persistence of oscillations at one half the scanning frequency and this may take the form of an inductance 19 and a condenser 20 connected in series across the condenser 14 of the main tune circuit. The auxiliary circuit is arranged to resonate at the undesired frequency and thus makes the voltages across the control electrodes, that is, the deflector plates 14, at this frequency negligible. It should also be arranged that the inductance 19 and condenser 20 of the auxiliary circuit have individually a high impedance and that the inductance 19 resonates with the condenser 14 of the main tuned circuit at a frequency not higher than say two thirds the scanning frequency.

In determining the capacity of the main tuned circuit it should be taken as including the self-capacity of the feed inductance 15.

Both the circuits described are such that there is, theoretically, no power dissipation. The actual power dissipation is therefore only that due to unavoidable losses and can be made relatively small.

Clearly, forms of switch other than thermionic valve such as 2 in Fig. 1 or 12 in Fig. 3 may be used. At relatively low frequencies mechanical switches can be used and they can be made to operate substantially sparklessly.

Although the invention has been described as applied to the control of cathode ray tubes it is clearly not limited to such uses but may be employed in many other fields where periodic oscillations of predetermined but other than sinusoidal wave form are required.

I claim:

1. An oscillation generator for generating periodic electrical oscillations of other than sinusoidal wave form comprising a circuit including an inductance for controlling the wave form of the generated oscillations during a part of each cycle thereof, a condenser constituting with said inductance a tuned circuit, said tuned circuit being operative to control said wave form during another part of each cycle, means for supplying control electrical signal impulses to said system, and means for transferring the control of said wave-form from the circuit including said inductance to said tuned circuit in response to control electrical impulse.

2. An oscillation generator for generating periodic electrical oscillations of other than sinusoidal wave form comprising a circuit including a condenser for controlling the wave form of the generated oscillations during a part of each cycle thereof, an inductance constituting with said condenser a tuned circuit, said tuned circuit being operative to control said wave form during another part of each cycle, means for receiving controlling electrical impulses, and means for transferring the control of said wave-form from said condenser to said tuned circuit in response to said electrical impulses.

3. An oscillation generator for generating, in response to applied electrical impulses, oscillations of frequency determined by the frequency of said impulses, comprising a source of electrical energy, a parallel tuned circuit, said tuned circuit being conductively in series with said source, means for impulsing said tuned circuit to commence oscillation in response to one of said impulses and rectifier means for automatically stopping said oscillation after one half cycle thereof.

4. Apparatus for generating electrical oscillations of saw-tooth wave-form in response to electrical impulses, comprising a source of electrical energy, a tuned circuit including an inductance and a condenser arranged in parallel, normally conductive switching means responsive to said impulses and a unidirectionally conducting device in parallel with said switching means, said tuned circuit and said switching means being arranged in series across said source and means responsive to said electrical impulses for making the switching means momentarily non-conductive.

5. Apparatus for generating electrical oscillations of saw-tooth wave-form in response to electrical impulses, comprising a source of electrical energy, a condenser and an impedance connected in series across said source, an inductance and a switching device connected in series with one another and in parallel with said condenser and means for rendering said switching device conductive in response to said impulses.

6. Apparatus for generating electrical oscillations of saw-tooth wave-form in response to electrical impulses, comprising a source of electrical energy, a tuned circuit, an impedance, means causing a progressively increasing current from said source to flow through said impedance for the greater part of each cycle of the generated oscillation and means responsive to said impulses for causing said tuned circuit to execute one half cycle of free oscillation during the remaining part of each cycle of the generated oscillation.

7. Apparatus for generating electrical oscillations of saw-tooth wave-form in response to electrical impulses, comprising a source of electrical energy, a tuned circuit, a condenser, means permitting a progressively increasing voltage, due to current flow from said source, to develop across said condenser during the greater part of each cycle of the generated oscillation and means responsive to said impulses for causing said tuned circuit to execute one half cycle of free oscillation during the remaining part of each cycle of the generated oscillation.

8. Apparatus for generating electrical oscillations of saw-tooth wave-form in response to electrical impulses, each cycle of said saw-tooth wave-form comprising a substantially uniformly increasing current occupying the greater part of each cycle followed by a rapid decrease in current for the remaining part of each cycle, said apparatus comprising a parallel tuned circuit, means conductively in series with said tuned circuit for impulsing the tuned circuit into oscillation in response to said impulses and rectifier means for limiting the duration of said rapid decrease in current to a single half cycle of oscillation of said tuned circuit.

9. Apparatus for generating electrical oscillations of saw-tooth wave form in response to electrical impulses comprising a source of electric energy, a parallel tuned circuit, a tube having a cathode, an anode and a control electrode, means connecting said tuned circuit and source in series between said anode and cathode, means comprising a resistor in said series circuit whereby the current flowing through said inductance increases at a linear rate, means for applying bias potential to the control electrode to render the tube normally conducting, and a source of control potential applied between said cathode and control electrode to render said tube non-conductive, the period of oscillation of said control potential being greater than that of the natural period of the tuned circuit.

10. A sawtooth oscillation generator system for magnetically deflecting a cathode ray beam developed within a cathode ray tube comprising electro-magnetic energy storage means tuned to a frequency substantially greater than the frequency of said generator system, said electro-magnetic energy storage means comprising the magnetic control means for deflecting the cathode ray in the cathode ray tube, means for storing energy in said electro-magnetic energy storage means, a uni-directional conductor coupled substantially in parallel with said electro-magnetic energy storage means and means for intermittently interrupting the storing of energy in said electro-magnetic energy storage means.

11. Apparatus in accordance with claim 10 wherein said uni-directional conductor coupled substantially in parallel with said electro-magnetic energy storage means comprises a diode.

12. A sawtooth oscillation generator system for magnetically deflecting a cathode ray beam developed within a cathode ray tube which comprises electro-magnetic energy storage means tuned to a frequency greater than the frequency of the sawtooth oscillations generated in said system, said electro-magnetic energy storage means comprising the magnetic control means for deflecting the cathode ray beam in the cathode ray tube, a thermionic vacuum tube having anode, cathode, and at least one control electrode, means for producing an anode-cathode current in said tube, means for storing at least a portion of the energy due to the anode current of said thermionic vacuum tube in said electro-magnetic energy storage means, a unilaterally conducting thermionic device having at least an anode and a cathode, said unilaterally conducting device being coupled substantially in parallel with the said electro-magnetic energy storage means and having the cathode element thereof electrically connected to the anode of said thermionic tube, and means for intermittently interrupting the storing of energy in said electro-magnetic energy storage means.

ALAN DOWER BLUMLEIN.